United States Patent [19]

Trieschmann et al.

[11] 3,992,277
[45] Nov. 16, 1976

[54] PROCESS AND APPARATUS FOR THE MANUFACTURE OF A GAS MIXTURE CONTAINING ACETYLENE, ETHYLENE, METHANE AND HYDROGEN, BY THERMAL CRACKING OF LIQUID HYDROCARBONS

[75] Inventors: Hans-Georg Trieschmann, Neustadt; Horst Rosewicz; Gerhard Jansen, both of Ludwigshafen; Dieter Ballweber, Frankenthal, all of Germany

[73] Assignee: BASF Aktiengesellschaft, Ludwigshafen (Rhine), Germany

[22] Filed: Jan. 14, 1975

[21] Appl. No.: 540,849

[30] Foreign Application Priority Data
Jan. 22, 1974 Germany............................ 2402844

[52] U.S. Cl................................ 204/172; 204/171; 250/544; 250/545
[51] Int. Cl.[2]...................... C07C 3/28; C07C 11/24
[58] Field of Search............... 204/171, 172, 168; 250/542, 544, 545

[56] References Cited
UNITED STATES PATENTS

| | | |
|---|---|---|
| 1,872,297 | 8/1932 | Jakosky .............................. 250/545 |
| 2,878,177 | 3/1959 | Kroepelin et al. ................... 204/172 |
| 2,900,321 | 8/1959 | Wangelin et al. ................... 250/543 |
| 3,519,551 | 7/1970 | Pechuro et al. ..................... 250/544 |
| 3,607,714 | 9/1971 | Vlalarou et al. .................... 250/545 |
| 3,682,807 | 8/1972 | Ishibashi ............................ 204/188 |
| 3,720,694 | 3/1973 | Junghans et al. ................ 260/397.5 |

*Primary Examiner*—F.C. Edmundson
*Attorney, Agent, or Firm*—Johnston, Keil, Thompson & Shurtleff

[57] ABSTRACT

A process for the manufacture of a gas mixture containing acetylene, ethylene, methane and hydrogen by cracking a liquid hydrocarbon by means of a plurality of arcs burning under the surface of the liquid hydrocarbon and limited, in their electrical effect, by current-limiting elements, wherein the total energy acting on the system is distributed by an arrangement of the electrical components, which is responsible for the stability of the arcs, over a plurality of localized burning points, the current-limiting components being matched to the voltage so that the output of each individual arc on average does not exceed 1.2 kW.

5 Claims, 2 Drawing Figures

PROCESS AND APPARATUS FOR THE MANUFACTURE OF A GAS MIXTURE CONTAINING ACETYLENE, ETHYLENE, METHANE AND HYDROGEN, BY THERMAL CRACKING OF LIQUID HYDROCARBONS

The present invention relates to a process and apparatus for the manufacture of a gas mixture containing acetylene, ethylene, methane and hydrogen by thermal cracking of liquid hydrocarbons by means of a plurality of arcs burning under the surface of the liquid hydrocarbon.

It is known to cause electrical discharges to act on liquid hydrocarbons under the surface of the latter so that the reaction gases, immediately after they have been generated, are cooled by the liquid hydrocarbon, and to distribute the electrical energy acting in the reactor over a plurality of localized burning points. However, in realizing this process industrially, it is found to be disadvantageous that striking the numerous arcs in liquid hydrocarbons is made very difficult by the good insulating effect of the hydrocarbons. Yet it is exactly this difficult striking of the arc which must take place as frequently as possible per unit time so as to keep the duration of action of the electrical energy short and to expose the resulting cracked gases rapidly to the cooling action of the surrounding liquid. On the other hand, it is necessary that in these cyclic processes the arcs should be stable. In one embodiment of the conventional processes, the electrodes are periodically moved toward one another, and the arc strikes as they approach and goes out as the movable electrode moves away. This bringing together of the electrodes must involve impact, so as to remove the objectionable graphite-like decomposition products from the electrodes. Apart from the increased cost of the apparatus and drive mechanism, the use of cyclically moving electrodes above all presents difficulties in regard to sealing the moving and externally driven electrodes against pressure or vacuum and at the same time ensuring their electrical insulation.

To avoid these disadvantages, attempts have been made to use spherical auxiliary electrodes which rest on a live grid and which, because of the heat generated by the ohmic resistance, generate gas bubbles, consisting of the cracked gas, at the points of contact. These gas bubbles then cause the arcs to strike. The resulting reaction products increase in volume and as a result move the auxiliary electrodes out of position, so that the arc goes out and the reaction products cool, whereupon the cycle is repeated.

The advantage of distributing the total energy over a plurality of localized areas is counterbalanced by the disadvantage that the energy comes into play in an uncontrolled manner since the distribution of the energy is determined by the adventitious position and shape of the surfaces which touch, and this uncontrolled energy input leads to severe carbonization.

It is an object of the present invention to provide a process for the manufacture of a gas mixture containing acetylene, ethylene, methane and hydrogen by cracking a liquid hydrocarbon by means of a plurality of arcs burning under the surface of the liquid hydrocarbon, in which process acetylene can be obtained in high yield and with little carbonization. It is a further object of the invention to provide a process in which by-products such as carbon monoxide, carbon dioxide and carbon oxysulfide are obtained in such small amount that the cracked gas can be fed directly to a gas separation facility, without any additional intermediate process stages.

According to the invention, these and other objects and advantages are achieved by a process for the manufacture of a gas mixture, containing acetylene, methane and hydrogen, by cracking a liquid hydrocarbon by means of a plurality of arcs burning under the surface of the liquid hydrocarbon and limited, in their electrical effect, by current-limiting elements, wherein the total energy acting on the system is distributed by an arrangement of electrical components, which is responsible for the stability of the arcs, over a plurality of localized burning points, the current-limiting elements being matched to the voltage so that the output of each individual arc on average does not exceed 1.2 kW.

Preferred starting materials are liquid hydrocarbons of boiling point not less than 35° C. Examples of suitable liquid hydrocarbons are light naphtha, light fuel oil, heavy fuel oil, gas oil and crude oil.

The plurality of arcs burning under the surface of the liquid hydrocarbon is generated by using a corresponding number of electrodes. The individual burning points can be wired in series, using the current-limiting elements. It is also possible to wire the electrodes in parallel, each being wired in series with a corresponding current-limiting element. In an advantageous embodiment of the process, each second pair of electrodes of the series-wired arrangement is movable and is brought into contact with the adjacent electrodes in order to strike the arc. In a further advantageous embodiment of the process, all the electrodes of the circuit remain immobile after the arcs have been struck.

It is an essential feature of the present invention that the current-limiting elements are matched to the voltage so that the output of each individual arc on average does not exceed 1.2 kW, preferably 1.0 kW and in particular 0.7 kW. Examples of suitable current-limiting elements are chokes and condensers. Preferably, chokes are used as current-limiting elements.

Apparatus for carrying out the process according to the invention can consist, for example, of two plastic plates fixed essentially parallel to the longitudinal axis of the reaction vessel and carrying electrodes, and a third plastic plate which is movable between the fixed plastic plates, and which can assume a position such that the rod electrodes of the movable plastic plate which are mounted at right angles to the surface of the said plate, short-circuit the electrodes projecting from the fixed plastic plates. By moving the movable plastic plate by means of a slide device, the rod electrodes of the movable plastic plate, on the one hand, and the electrodes of the fixed plastic plates, on the other, are finally brought into such proximity that a plurality of arcs are struck. The electrodes of the fixed carrier plates are, for example, U-shaped, with the ends of the U-shapes pointing toward the movable plastic plate. The distance between the end of the U-shaped electrodes preferably corresponds to the distance between two successive rod electrodes on the movable plastic plate. The voltage is preferably applied between the first and the last of the plurality of electrodes wired in series. The effective electrical energy is preferably limited by a choke in the circuit. In general, alternating voltages of from 3 to 10 kV, preferably from 4 to 7 kV, are used to carry out the process. These voltages can be generated by, e.g., a transformer. However, where available, they can also be taken from the mains.

Figure 1:
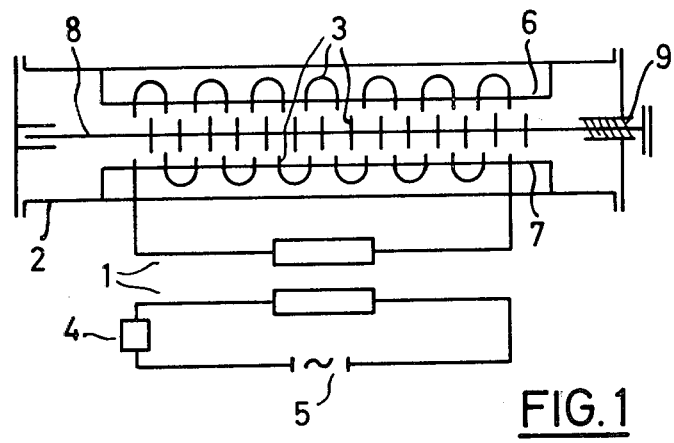
FIG. 1 is a schematic drawing of the electrical circuit.

FIG. 1 shows an embodiment of the electrical circuit and arrangement of the electrodes. It consists of the transformer 1, comprising a low voltage and high voltage part, and the reaction vessel 2 with the electrodes 3 arranged in series, as well as the choke 4, in the primary circuit, and the source of current 5. The electrodes are mounted in two fixed plastic plates 6 and 7 and a movable plate. A slide device 9 for the movable plate 8 is provided in the wall of the reaction vessel 2. The movable plate 8 is shown, in FIG. 1, in the burning position, after the arcs have been struck by being made to touch and then being drawn apart. The electrodes can be renewed simply by replacing the carrier plates 6, 7 and 8.

The gas mixture, containing acetylene, ethylene, methane and hydrogen, which is generated in the reaction chamber is preferably discharged and separated by conventional methods, so as to isolate the desired products, such as acetylene, ethylene, methane and hydrogen. To remove the solid reaction products formed in the reaction chamber, the liquid hydrocarbon is, in general, discharged entirely or partially from the reaction chamber, the solids are removed from the discharged material and the liquid hydrocarbons are cooled and recycled to the reaction chamber. Liquid hydrocarbons of high viscosity at room temperature, for example crude oil, are preferably heated to a temperature below their evaporation point, in order to lower their viscosity, before they enter the reaction chamber.

Figure 2:
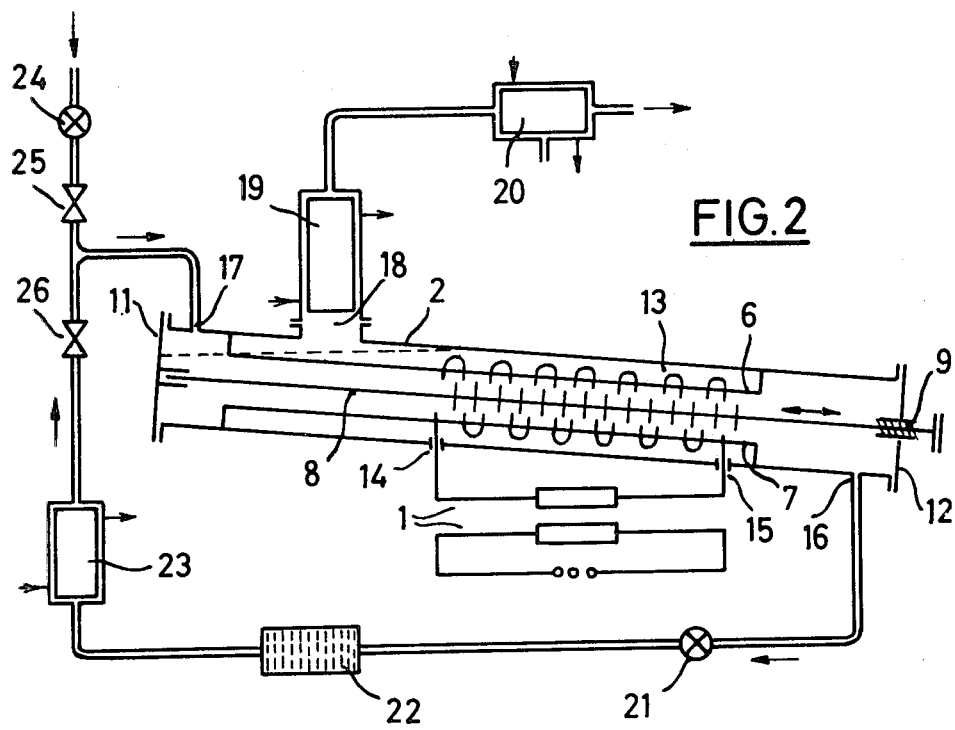
FIG. 2 is a schematic drawing of the cracking apparatus.

A device according to the invention for carrying out the process consists, e.g., as shown in FIG. 2, of a preferably cylindrical vessel 2 closed by two lids 11 and 12. To facilitate removing the carbon black formed, the reaction vessel 2 slopes slightly. The lower lid 12 has an insulated orifice through which passes the slide device 9 for the central electrode carrier plate 8. When the electrode carrier plate 8 is moved sideways, the rod electrodes present therein touch the electrodes located in the fixed carrier plates 6 and 7 and connected in pairs to to one another by arc-shaped conductors 13, so that all the electrodes shortcircuit. By sliding the central electrode carrier plate in the opposite direction, the electrodes are again separated from one another and the arcs are struck. The reaction vessel in addition has two electrically insulated orifices 14 and 15 for the leads from the transformer 1, and also, at its lowest point, an orifice 16 for discharging the liquid containing solids and, at its highest point, an orifice for introducing the filtered reaction liquid 17 and an orifice for discharging the reaction gases, 18. A condenser 19 is mounted over the latter orifice and condenses the entrained higher-boiling constituents and returns them into the reaction vessel. From 19, the gas passes through the condenser 20 in which further higher-boiling constituents of the gas mixture are separated off. To isolate the solids, the liquid hydrocarbons are drawn off through the orifice 16 by means of the pump 21, freed from solids in the separator 22, cooled by the cooler 23 and recycled to the reaction vessel 2 through the orifice 17. The consumed starting product can be replaced by means of the pump 24, the input being regulated by the valves 25 and 26.

EXAMPLE

The starting material used was crude gasoline of boiling range from 45° to 120° C. The amount of carbon black produced, determined gravimetrically, averaged 18 g per cubic meter of cracked gas or 60 g per kg of acetylene formed. The electrical energy consumption averaged 9 kWhr per kg of acetylene. A cracked gas of the following composition was obtained from 2 kg of crude gasoline by application of 8.5 kWhr.

| | | |
|---|---|---|
| Carbon dioxide | 0.05% | by volume |
| Carbon monoxide | 0.14 | '' |
| Oxygen | 200 | ppm (by volume) |
| Nitrogen | 0.12% | by volume |
| Hydrogen | 45.5 | '' |
| Methane | 4.9 | '' |
| Ethane | 0.51 | '' |
| Ethylene | 8.0 | '' |
| Acetylene | 26.0 | '' |
| Propane | 0.13 | '' |
| Propene | 2.7 | '' |
| Propadiene | 0.39 | '' |
| Propine | 0.6 | '' |
| Cyclopropane | 25 | ppm (by volume) |
| n-Butane | 0.11% | by volume |
| Isobutane | 230 | ppm (by volume) |
| Butene-1 | 0.2% | by volume |
| Isobutene | | |
| trans-Butene-2 | 340 | ppm (by volume) |
| cis-Butene-2 | 280 | '' |
| 1,3-Butadiene | 0.35% | by volume |
| 1,2-Butadiene | 250 | ppm (by volume) |
| Vinylacetylene | 0.6% | by volume |
| Diacetylene | 2.8% | '' |
| n-Pentane | 0.9% | by volume |
| Isopentane | 0.45 | '' |
| 2,3-Dimethylbutane<br>2-Methylpentane<br>Cyclopentane | 1.1 | '' |
| 3-Methylpentane | 0.50 | '' |
| n-Hexane | 1.4 | '' |
| Cyclohexane | 0.65 | '' |
| n-Heptane | 0.27 | '' |
| Methylcyclohexane | 0.14 | '' |
| 2,3-Dimethylpentane<br>3-Methylhexane | 0.35 | '' |
| Benzene | 0.12 | '' |
| Toluene | 300 | ppm (by volume) |
| $C_5$-hydrocarbons | 0.14% | by volume |
| $C_6$-hydrocarbons | 0.60 | '' |
| $C_7$-hydrocarbons | 0.28 | '' |
| Sulfur as $H_2S$ | 6 | mg/m³ (S.T.P.) |
| Organically bonded sulfur | 1 | '' |
| $CS_2$ | 0.02 | mg/m³ |

If the constituents of the analyzed gases are classified into higher-boiling and lower-boiling materials, it is found that the low-boiling constituents acetylene, ethylene, hydrogen, methane, ethane, propene and propadiene account for about 88%, and hydrogen, acetylene and ethylene together account for 80% of the cracked gas. The proportion of higher-boiling constituents is about 10% and consists of vinylacetylene, diacetylene and hydrocarbons of 5 to 7 carbon atoms. The cracked gas can be substantially freed from these constituents by subsequent cooling to low temperatures, as a result of which the percentage composition of low-boiling products changes and the proportion of acetylene rises to 29%. The values thus calculated from analysis by gas chromatography agree well with the values for acetylene determined from three experiments by conventional gas analysis (29.4% by volume, 30.0% by volume and 30.6% by volume).

We claim:

1. A process for the manufacture of a gas mixture containing as major components, acetylene, ethylene, methane and hydrogen which comprises: cracking a liquid hydrocarbon by means of a plurality of arcs burning under the surface of the liquid hydrocarbon, said arcs being produced between stationary electrodes, and limited, in their electrical effect, by the use of chokes or condensers as current-limiting elements, wherein the total energy acting on the system is distributed by an arrangement of the electrical components, which is responsible for the stability of the arcs, over a plurality of localized burning points, the current-limiting elements being matched to the voltage so that the output of each individual arc on average does not exceed 0.7 kW, and wherein voltages of from 3 to 10 kV are used to carry out the process.

2. A process as set forth in claim 1 wherein said liquid hydrocarbons are hydrocarbons having boiling points of not less than 35° C.

3. A process as set forth in claim 2 wherein the liquid hydrocarbons are light naptha, light fuel oil, heavy fuel oil, gas oil, and crude oil.

4. A process as set forth in claim 2 wherein the hydrocarbons are heated to a temperature below their evaporation point.

5. A process as set forth in claim 1 wherein the voltage is from 4 to 7 kV.

* * * * *